United States Patent [19]

Ripple

[11] 4,220,220

[45] Sep. 2, 1980

[54] LOUDSPEAKER EQUIPMENT

[76] Inventor: Warren Ripple, 3345 Marko St., Sarasota, Fla. 33580

[21] Appl. No.: 22,434

[22] Filed: Mar. 21, 1979

Related U.S. Application Data

[63] Continuation-in-part of Ser. No. 886,991, Mar. 16, 1978, Pat. No. 4,161,230, which is a continuation of Ser. No. 687,353, May 17, 1976, abandoned, which is a continuation-in-part of Ser. No. 615,364, Sep. 22, 1975, abandoned.

[51] Int. Cl.[2] .............................................. H05K 5/00

[52] U.S. Cl. .................................... 181/148; 181/152; 181/156; 181/199

[58] Field of Search ............... 181/148, 199, 156, 145; 179/1 E

[56] References Cited

U.S. PATENT DOCUMENTS

| | | | |
|---|---|---|---|
| 2,036,832 | 4/1936 | Scheldorf | 181/145 |
| 3,443,661 | 5/1969 | Van Sciver | 181/199 |
| 3,547,220 | 12/1970 | Watson | 181/199 |
| 3,746,125 | 7/1973 | Hammes | 181/199 |
| 3,882,962 | 5/1975 | Ripple | 181/148 |
| 4,147,229 | 4/1979 | Flashman | 181/148 |

*Primary Examiner*—L. T. Hix
*Assistant Examiner*—Benjamin R. Fuller
*Attorney, Agent, or Firm*—Kenneth P. Synnestvedt

[57] ABSTRACT

Loudspeaker equipment embodying a speaker, an enclosure for the speaker which is substantially closed except for the speaker opening and which is formed of walls which are thin and therefore capable of excitation and consequent sound generating vibrations under the influence of the speaker, the speaker equipment further including a reflector surrounding the speaker enclosure and having an open front through which the speaker is exposed, the walls of the reflector being spaced from the walls of the speaker enclosure to provide a passage through which sound generated by the walls of the speaker enclosure is reflected forwardly. The side walls of the reflector include a plurality of wall elements with adjacent edges spaced from each other and having a thickness dimension sufficiently small to provide for excitation and sound generation under the influence of the speaker enclosure within the reflector.

4 Claims, 3 Drawing Figures

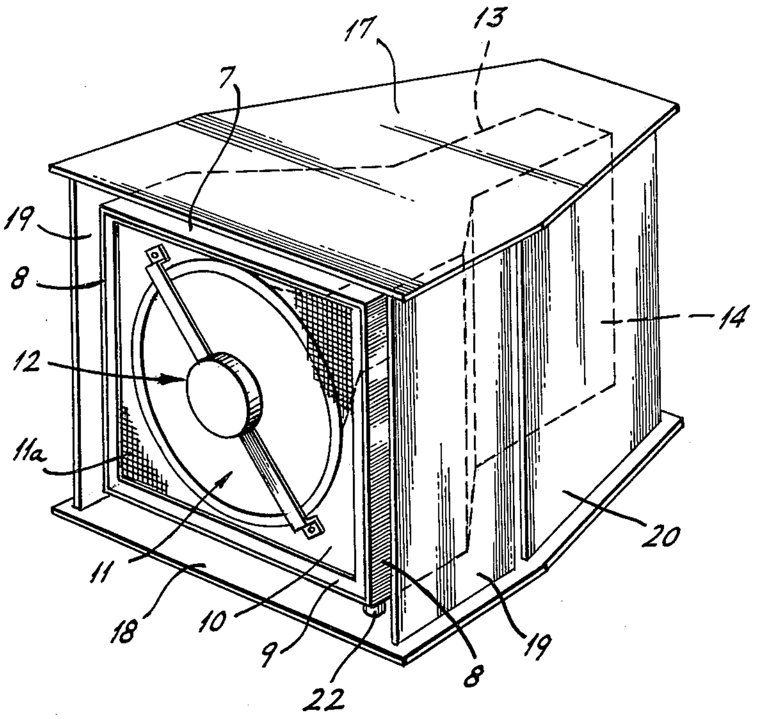
FIG. 1.
FIG. 2.
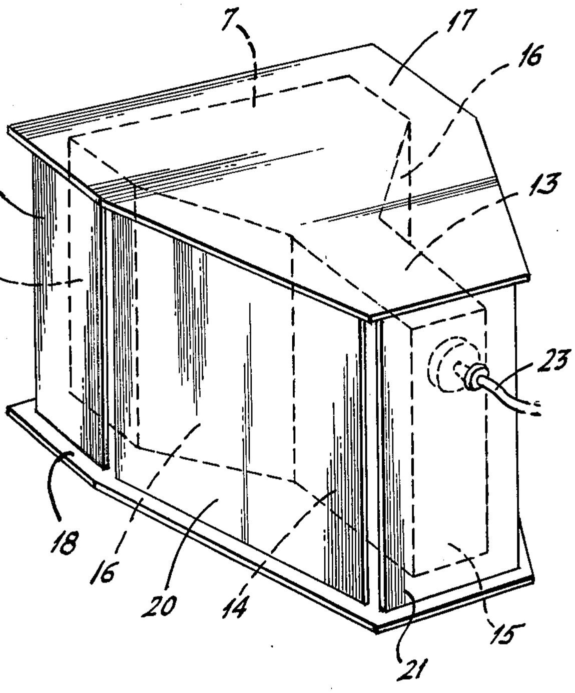
FIG. 3.
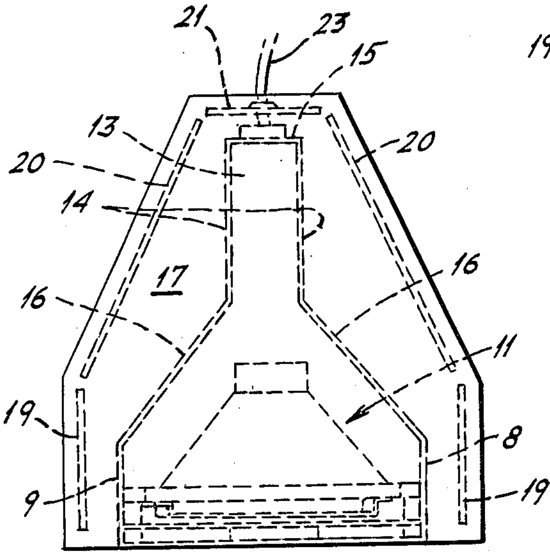

LOUDSPEAKER EQUIPMENT

CROSS REFERENCES

The present application is a continuation-in-part of my application Ser. No. 886,991, filed Mar. 16, 1978, and issued as U.S. Pat. No. 4,161,230, which is a continuation of my application Ser. No. 687,353, filed May 17, 1976, now abandoned, which in turn is a continuation-in-part of my application Ser. No. 615,364, filed Sept. 22, 1975, now abandoned.

BACKGROUND AND STATEMENT OF OBJECTS

The present invention is concerned with speaker equipment, particularly equipment comprising a speaker of the well-known cone type, and the invention is especially concerned with certain mounting, enclosing and sound reflecting devices for such speakers.

In my prior applications above identified, the speaker itself is mounted in an enclosure having a chamber of relatively small total volume and which is also characterized by the provision of intercommunicating front and rear chamber compartments, the front compartment having a panel with an opening through which the speaker is exposed, which front compartment is of relatively large volume, as compared with the rear compartment. The enclosure walls of a speaker according to said prior applications are formed of relatively thin sheet material, for instance plywood of the order of $\frac{1}{8}''$ in thickness, and the speaker enclosure is substantially imperforate except for the opening where the speaker is exposed. In speakers of this type, the enclosure walls themselves are excited and experience consequent sound generating vibrations under the influence of the speaker, at least at frequencies in the lower portion of the audio range.

As will further appear, in the preferred embodiment of the speaker enclosure, the forward or larger compartment of the speaker enclosure is substantially rectangular and is characterized by a dimension in the direction of the axis of the speaker which is relatively small; and the rear or smaller compartment is characterized by being configured as a relatively thin "tail" projecting rearwardly from the forward compartment. By the employment of speaker compartments as just described, tendency for development of resonant points within the enclosure is greatly diminished, so that the sound generation is relatively uniform over a broad frequency range, notwithstanding the fact that the total internal volume of the speaker enclosure is relatively small.

The principal object of the present invention is to further improve the operation of speaker equipment of the kind in which the walls of the enclosure participate in the sound generation, and especially speaker equipment embodying speaker enclosures such as referred to above and more fully described in my prior applications Ser. No. 615,364 and Ser. No. 886,991, above identified. More specifically, the present invention contemplates the provision of means for increasing the effectiveness and direction of propagation of the sound generated by the excitation and vibration of the walls of the thin walled speaker enclosure.

This is accomplished in accordance with the present invention by the employment of a reflector or enclosing hood or horn for the speaker enclosure, the reflector having an opening at the front in which the speaker enclosure is received, the reflector being dimensioned in relation to the speaker enclosure so as to provide a forwardly opened passage preferably at all sides of the speaker enclosure. This reflector directs the sound generated by the walls of the speaker enclosure in the forward direction and thus into the normal listening area.

Still further, the present invention involves a further improvement as compared with the reflector arrangement disclosed in my prior application Ser. No. 886,991 above identified. Thus, in accordance with the present invention, the reflector has side walls each of which is made up of a plurality of elements, preferably with the edges thereof somewhat spaced from each other and with the elements at each side preferably also of different width. The present invention still further contemplates that the side wall elements be formed of panels which are thin enough to provide for excitation and sound generation under the influence of the speaker enclosure lying within the reflector. In this way, in the low frequency end of the spectrum, still further sound generation may be developed; and by employing side wall panels of different width, tendency for development of excessive peaks or resonance points is diminished.

BRIEF DESCRIPTION OF THE DRAWINGS

How the foregoing objects and advantages are attained together with others which will occur to those skilled in the art will appear more fully from the following description referring to the accompanying drawings, in which:

FIG. 1 is an isometric three quarter front view of speaker equipment according to the present invention incorporating a speaker, with a surrounding speaker enclosure, and with the enclosure mounted within a reflector constructed according to the present invention;

FIG. 2 is an isometric three quarter rear view of the equipment shown in FIG. 1; and FIG. 3 is a plan view of the equipment shown in FIGS. 1 and 2.

DETAILED DESCRIPTION

Referring to the drawing, it will be seen that the speaker enclosure incorporates side walls such as indicated at 7, 8—8 and 9 which define the sides of a generally rectangular front compartment in which the wall 10 is mounted. This front wall is rectangular or square to fit between the walls 7, 8—8 and 9 and has a circular opening for cooperation with the speaker itself which is diagrammatically indicated at 11.

The speaker may be of single cone construction, but if desired may also include a supplemental high frequency speaker such as a cone or dome indicated at 12. The speakers are covered by an appropriate grill or cloth indicated at 11*a*.

The top and bottom walls 7 and 9 are each provided with a rearward extension, one of which appears at 13, for defining the top and bottom of the rear compartment of the speaker enclosure. Side walls 14—14 are also provided for the rear compartment, as is a rear end wall 15. The rear compartment projects rearwardly from the front compartment in the mid region thereof, and each pair of side walls 8 and 14 at the sides of the rear compartment are joined by inclined walls 16—16. It will be seen that in this embodiment, the rear compartment is in the form of a "tail" having its large dimension lying in a vertical plane and extended rearwardly from the front compartment in that plane. Moreover, as is shown, the rear compartment is of the same vertical dimension as the forward compartment, and the top and bottom of the rear compartment are defined by the extensions 13 of the top and bottom walls 7 and 9 of the front compartment. This configuration facilitates fabrication because of the use of a common element for defining certain corresponding walls of the front and rear compartments.

As shown in FIGS. 1 and 2, the speaker enclosure of this first embodiment is used or received within a reflector formed of flat or planar top and bottom walls 17 and 18, and side walls which are formed of a plurality of elements or panels. Thus, the wall toward each of the opposite sides has a panel 19 toward the front of the speaker and another panel 20. The two side wall panels 19—19 toward the front of the speaker are positioned in parallel planes; and the two side wall panels 20—20 lie in planes converging toward the rear of the reflector. A rear wall panel 21 is provided behind the rear end of the speaker enclosure within the reflector.

It will be noted from the drawing that the adjacent edges of all of the vertical wall panels are somewhat spaced from each other; and as clearly appears in the drawings, the panels are of different widths. The panel elements 19 are smaller than the panel elements 20, and the panel element 21 at the back is smaller than the elements 19. The upright reflector walls may be divided into more panels than illustrated in the figures if desired, in which event it would be preferred to maintain some difference in the width of at least some of the panels at each side.

Preferably the reflector is proportioned and dimensioned in relation to the corresponding dimensions of the speaker enclosure to provide clearance at all sides between the walls of the reflector and the walls of the speaker enclosure. Advantageously this clearance is of the order of one or a few inches. In a typical embodiment incorporating a speaker having a cone of 10" in diameter and with the speaker enclosure and reflector proportioned substantially as indicated in the drawings, the clearance between the walls at the top and bottom is of the order of 2", and the clearance at the opposite sides is of the order of 3" in the region of the mouth of the reflector. As will be understood, this clearance varies in different regions because of the differences in shape of the speaker and of the speaker enclosure as will be seen from examination of the plan view of FIG. 3. The speaker enclosure may be positioned within the reflector in any of a number of ways, for instance by the use of spacers, such as indicated in FIG. 1 by the reference numeral 22. Such spacers may be provided at any desired location in order to establish the desired positional relationship of the enclosure and the reflector.

It will be understood that appropriate electrical connections for feeding the signal to the speaker will be provided, for instance through the rear wall panel 15 of the speaker enclosure and the rear wall panel 23 of the reflector.

Certain additional structural features of the speaker enclosure and of the reflector should be noted, as follows.

First, with reference to the speaker enclosure, the walls thereof are advantageously formed of sheet material, and while certain plastics may be utilized, it is preferred to employ sheet material such as plywood. This sheet material should be quite thin, preferably less than ¼" in thickness, for instance of the order of ⅛", the walls being bonded to each other at the meeting edges by any appropriate adhesive and preferably without extensive or highly rigid reinforcement strips which would interfere with the desired participation of the enclosure walls in the sound generation.

It is also contemplated that some fibrous material, for instance thin fiber glass mat of low density be applied to the inside surfaces of the speaker enclosure walls. The fibrous material may be adhesively secured to the inside surfaces, and advantageously this material comprises only a relatively thin layer averaging about ¼" to ½" in thickness. Such a thin fibrous layer assists in minimizing reflection of sound waves at the high frequency end of the spectrum, without resulting in impairment of low frequency excitation of and radiation from the walls of the enclosure, and I have found that these factors assist in providing the desired participation of the enclosure itself in the radiation of sound.

The configuration of the speaker as described above and particularly the provision of the two interconnected compartments substantially differing from each other in volume, with the rear compartment in the form of what might be termed a "tail" of wide and thin shape projecting rearwardly from the front compartment, provides an enclosure which extensively participates in the sound generation, without producing sharply peaked resonant points, notwithstanding the fact that the total internal volume of the enclosure is quite small.

Typical dimensions of speaker enclosures and of the compartments thereof are generally indicated by the relationship between the size of the speaker to the size of the enclosure, as shown in the drawings. Some variation of sizes is, of course, usable in accordance with the invention, but general proportions of the speaker enclosure may be determined from an example such as given just below.

Thus, assuming that the cone speaker 11 of FIGS. 1 and 2 is 10" in diameter, the face panel 10 is desirably about 12" by 12". In this example, the depth of the front compartment behind the face panel 10 is of the order of 4" and the junction portion defined by the inclined walls 16—16 is of the order of 5", measured in a direction perpendicular to the front wall. The length of the tail of the enclosure of this example would be of the order of 7" (extended rearwardly from the inclined walls 16—16) and the thickness of the "tail" would be about 3".

It will be understood that the dimensions referred to are given by way of example and not by way of limitation, but because of the relatively small size of the enclosure volume, the example will assist in establishing appropriate dimensions and proportions. For a smaller speaker cone, for instance an 8" speaker, proportionate reductions in the dimensions would be usable, and for a larger cone for instance, a 12" cone, proportionately larger dimensions would be usable.

With regard to the construction of the reflector, preferably the walls of the reflector are of greater thickness than those of the speaker enclosure, but it is contemplated that the reflector walls be thin enough so that the side wall elements or panels will participate to some extent at the low end of the frequency range. This participation is enhanced also by employing side walls made up of several panels, instead of only a single panel wall. It is, of course, contemplated that the reflector serve the reflection function, somewhat in the manner of a horn; but in addition, the subdivision of the side walls into panels somewhat spaced from each other also aids in enhancing dispersion of the sound from the speaker enclosure lying within the reflector. The reflector walls although usually somewhat thicker than the walls of the speaker enclosure may even be of substantially the same thickness as the walls of the speaker enclosure, but it is contemplated that the reflector side walls should be of the order of 3/16" or somewhat thicker. The top and bottom walls are desirably thicker than the side walls, for instance on the order of ⅜" or thicker.

The dimensions of a typical reflector shaped in accordance with the embodiment shown in the drawing will, of course, depend upon the size of the speaker and speaker enclosure being employed, and with the proportions shown in the drawing and the exemplary dimensions for the speaker enclosure given hereinabove, appropriate dimensions for the reflector can readily be ascertained.

The external surfaces of the reflector may be finished or decorated in any desired manner, and it is noted that while the side walls converge rearwardly, the top and bottom walls are flat and parallel, so that when used in typical living quarters, the top of the reflector may be employed in the manner of an end table or cabinet. Preferably, the interior surface of the reflector is not highly polished, and may advantageously have some type of grain or matte finish, or may even be cloth covered, in order to reduce tendency to develop resonant points at high frequencies in the audio spectrum.

The speaker equipment of the present invention not only provides various of the advantages referred to in my prior applications above fully indentified, and including the advantage of the reflector function; but in addition, the construction of the reflector further enhances dispersion of the sound generated.

It should be noted that the shape of the speaker enclosure, including the relative proportions of the front and rear compartments of the speaker enclosure may be varied from those illustrated herein by way of example. Thus, the rear compartment of "tail" of the speaker enclosure may be offset from the mid plane of the speaker enclosure, as in one of the embodiments illustrated in my prior application Ser. No. 615,364 above referred to. In any event, regardless of the specific shape of the speaker enclosure, in all embodiments according to the present invention, provision is made for the placement of a speaker enclosure within a reflector, the speaker enclosure being of the type which will itself participate in the generation of the sound, the reflector being arranged to direct a portion of the generated sound in the general manner of a horn, while at the same time, effecting some lateral dispersion at least at very low frequencies. Regardless of the shape of the speaker enclosure, it is also contemplated according to the invention that the speaker enclosure be substantially imperforate except for the speaker opening.

I claim:

1. Loudspeaker equipment comprising a speaker, a speaker enclosure having enclosure walls defining a speaker chamber having front and rear intercommunicating compartments, the front compartment being generally rectangular and having a rectangular front wall with an opening therein with the speaker mounted thereon and exposed through the opening, the side walls of the front compartment defining a generally rectangular compartment space, the rear compartment having one dimension equal to one dimension of said front wall and having a dimension perpendicular to the first dimension substantially smaller than the first dimension, two opposite side walls of the front compartment having rearward extensions of smaller width than said two side walls and serving as side walls of the rear compartment, and the rear compartment having additional walls of the same dimension as the other two of the side walls of the front compartment cooperating with said extensions in defining a generally rectangular rear compartment space, one transverse dimension of which is substantially smaller than the corresponding dimension of the front compartment and the other transverse dimension of which is substantially equal to the corresponding dimension of the front compartment, the enclosure walls being at least in large part formed of thin sheet material capable of excitation and consequent sound generation under the influence of the speaker at least at frequencies in the lower portion of the audio range, and a reflector in which the speaker and its enclosure are positioned, the reflector having an opening at the front through which the speaker is exposed, said opening being larger than the front compartment of the speaker enclosure to provide clearance at all sides of the speaker enclosure, the reflector being formed of horizontal and vertical wall elements, the horizontal wall elements comprising top and bottom wall elements vertically spaced from each other to receive the speaker enclosure therebetween, and the vertical wall elements comprising side wall elements, said top, bottom and side reflector wall elements being positioned and spaced to define the front opening of the reflector through which the speaker is exposed, the side wall elements of the reflector including a plurality of elements at each side with adjacent edges spaced from each other, and said plurality of elements of the reflector further including elements toward the rear of the reflector at opposite sides thereof at least a portion of which are spaced from each other a distance substantially less than the spacing of the side wall elements of the reflector at the front opening of the reflector, the side wall elements of the reflector being spaced from each other sufficiently to provide clearance at the side walls of the speaker enclosure.

2. Loudspeaker equipment as defined in claim 1 in which at least the side wall elements of the reflector have a thickness dimension sufficiently small to provide for excitation and sound generation under the influence of the speaker enclosure.

3. Loudspeaker equipment as defined in claim 2 in which the side wall elements at each side wall of the reflector include elements of different width.

4. Loudspeaker equipment as defined in claim 3 in which the vertical wall elements of the reflector further include at least one rear wall element of different width than at least one side wall element at each side of the reflector.

* * * * *